(12) United States Patent
Kim

(10) Patent No.: US 8,441,282 B2
(45) Date of Patent: May 14, 2013

(54) IMPEDANCE CALIBRATION CIRCUIT AND IMPEDANCE CALIBRATION METHOD

(75) Inventor: Mi Hye Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/187,603

(22) Filed: Jul. 21, 2011

(65) Prior Publication Data

US 2012/0146687 A1    Jun. 14, 2012

(30) Foreign Application Priority Data

Dec. 10, 2010 (KR) .................. 10-2010-0126444

(51) Int. Cl.
*H03K 19/003* (2006.01)
(52) U.S. Cl.
USPC .......................................... 326/30

(58) Field of Classification Search ............ 326/30
See application file for complete search history.

(56) References Cited

U.S. PATENT DOCUMENTS

| 7,400,165 | B2 * | 7/2008 | Park ........................ 326/30 |
| 2008/0048714 | A1 * | 2/2008 | Lee et al. ................. 326/30 |
| 2009/0146685 | A1 * | 6/2009 | Kim et al. ................ 326/33 |

* cited by examiner

*Primary Examiner* — Crystal L Hammond
(74) *Attorney, Agent, or Firm* — William Park & Associates Patent Ltd.

(57) ABSTRACT

An integrated circuit includes a first ODT (On Die Termination) unit and an input buffer. The first ODT unit is configured to receive at least one pull-up code and at least one pull-down code and calibrate a resistance value for impedance matching of a first line transferring data. The input buffer is configured to buffer the data in response to a reference voltage level and drive input data. Herein, the driving of the input data is controlled in response to the pull-up code and the pull-down code.

20 Claims, 4 Drawing Sheets

IMPEDANCE CALIBRATION CIRCUIT AND IMPEDANCE CALIBRATION METHOD

CROSS-REFERENCES TO RELATED APPLICATIONS

The present application claims priority under 35 U.S.C 119(a) to Korean Application No. 10-2010-0126444, filed on Dec. 10, 2010, in the Korean intellectual property Office, which is incorporated herein by reference in its entirety set forth in full.

BACKGROUND

A synchronous memory device operates in synchronization with a clock to improve the operation speed of a semiconductor memory device. An SDR (single data rate) synchronous memory device inputs/outputs one data in one clock cycle through one data pin in synchronization with a rising edge of a clock. However, the SDR synchronous memory device is insufficient to satisfy the speed requirement of a system performing a high-speed operation. Therefore, a DDR (Double Data Rate) synchronous memory device processing two data in one clock cycle is being used.

The DDR synchronous memory device inputs/outputs two consecutive data through each data input/output pin in synchronization with a rising edge and a falling edge of an external clock. Thus, the DDR synchronous memory device can implement at least two times larger bandwidth than the SDR synchronous memory device, thus making it possible to implement a higher-speed operation.

As the operation speed of semiconductor memory devices increases, the swing width of an interface signal, which is transmitted between the semiconductor memory devices or between the semiconductor memory device and a memory controller, decreases gradually. As the swing width of the interface signal decreases, the influence on an external noise increases and the signal reflection caused by impedance mismatching at an interface terminal becomes serious. The impedance mismatching may make high-speed signal transmission difficult and may distort data outputted from an output terminal of the semiconductor memory device.

Thus, a semiconductor memory device operating at a high speed may include an impedance matching circuit called an ODT (On Die Termination). In general, the ODT performs a source termination at a transmitting terminal by an output circuit, and performs a parallel termination at a receiving terminal by a termination circuit that is connected in parallel to a receiving circuit connected to an input pad.

The resistance value of an ODT varies according to the PVT (Process, Voltage and Temperature) conditions. Thus, a semiconductor memory device includes an impedance calibration circuit that performs a ZQ calibration operation by an external resistor to calibrate the changed resistance value of the ODT.

FIG. 1 is a diagram illustrating a structure of a known impedance calibration circuit.

Referring to FIG. 1, a known impedance calibration circuit includes a pad 11 to which an external resistor R is connected, comparators 12 and 16, counters 13 and 17, pull-up units 14 and 15, and a pull-down unit 18.

Referring to FIG. 1, the comparator 12 compares a pad voltage ZQ with a reference voltage VREF and drives the counter 13 that counts a pull-up code PCODE<1:N> to equalize the resistance of the pull-up units 14 and 15 to the resistance of the external resistor R. When the resistance of the pull-up units 14 and 15 is equalized to the resistance of the external resistor R by the pull-up code PCODE<1:N> counted by the counter 13, the counter 13 stops operating.

The comparator 16 compares a voltage of a node nd10 with the reference voltage VREF and drives the counter 17 that counts a pull-down code NCODE<1:N> to equalize the resistance of the pull-down unit 18 to the resistance of the pull-up unit 15. When the resistance of the pull-down unit 18 is equalized to the resistance of the pull-up unit 15 by the pull-down code NCODE<1:N> counted outputted by the counter 17, the counter 17 stops operating.

As described above, the known impedance calibration circuit equalizes the resistance of the pull-up units 14 and 15 to the resistance of the external resistor R and then equalizes the resistance of the pull-down unit 18 to the resistance of the pull-up unit 15. That is, the known impedance calibration circuit equalizes the resistance of the pull-up units 14 and 15 and the pull-down unit 18 to the resistance of the external resistor R according to a PVT condition change.

However, there may be a 'calibration range over' phenomenon that makes it impossible to equalize the resistance of the pull-up units 14 and 15 and the pull-down unit 18 to the resistance of the external resistor R. The calibration range over phenomenon may include a case where the resistance of the pull-up units 14 and 15 cannot be equalized to the resistance of the external resistor R even by the counting of the pull-up code PCODE<1:N> and a case where the resistance of the pull-down unit 18 cannot be equalized to the resistance of the pull-up unit 15 even by the counting of the pull-down code NCODE<1:N>.

If the resistance of the pull-up units 14 and 15 cannot be equalized to the resistance of the external resistor R, the pull-down code NCODE<1:N> is counted by the pull-up unit 15 whose resistance is calibrated by a pull-up code PCODE<1:N> of which counting is completed (e.g., when the pull-up code PCODE<1:N> has highest value). In this case, the resistance of the pull-down unit 18 is equalized to the resistance of the pull-up unit 15.

However, if the resistance of the pull-down unit 18 cannot be equalized to the resistance of the pull-up unit 15 even by the counting of the pull-down code NCODE<1:N>, the pull-up code PCODE<1:N> cannot be again counted. In this case, the operation of the impedance calibration circuit may be terminated without equalizing the resistance of the pull-down unit 18 to the resistance of the pull-up unit 15.

SUMMARY

An embodiment of the present invention relates to an impedance calibration circuit and an impedance calibration method that can equalize the impedance of a pull-up unit and the impedance of a pull-down unit.

In an exemplary embodiment, an impedance calibration circuit includes a pull-up code calibrating unit configured to compare a pad voltage of a pad, to which an external resistor is connected, with a reference voltage during a first period to generate a pull-up code for calibrating the resistance of a first pull-up unit that pulls up the pad voltage, and compare a first voltage with the reference voltage during a second period from the end time point of the first period to generate the pull-up code, and a pull-down code calibrating unit including a second pull-up unit configured to calibrate the resistance in response to the pull-up code to pull up the first voltage and a pull-down unit configured to pull down the first voltage, wherein the pull-down code calibrating unit compares the first voltage with the reference voltage during the first period to generate a pull-down code for calibrating the resistance of the pull-down unit, wherein the first voltage is driven by the second pull-up unit and the pull-down unit.

In another exemplary embodiment, an impedance calibration method includes dividing an impedance calibration period into a first period and a second period, comparing a pad voltage of a pad, to which an external resistor is connected, with a reference voltage during the first period to generate a pull-up code for calibrating the resistance of a first pull-up unit that pulls up the pad voltage and the resistance of a second pull-up unit that pulls up a first voltage, comparing the first voltage with the reference voltage during the first period to generate a pull-down code for calibrating the resistance of a pull-down unit that pulls down the first voltage, and comparing the first voltage with the reference voltage during the second period to generate the pull-up code, wherein the first voltage is driven by the second pull-up unit and the pull-down unit.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
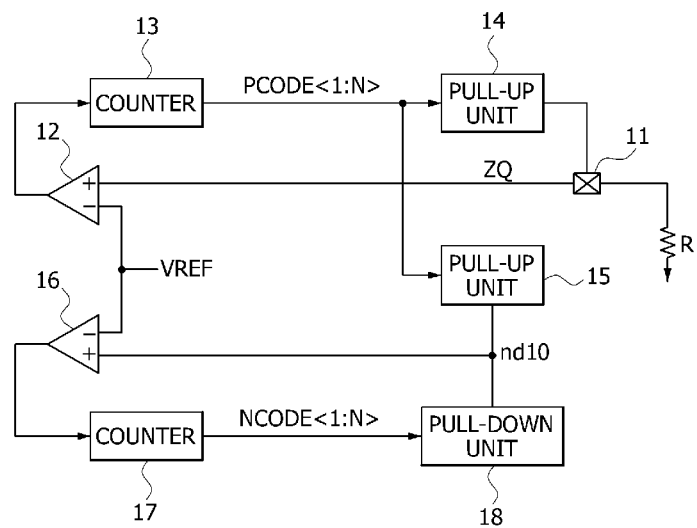
FIG. 1 is a diagram illustrating a structure of a known impedance calibration circuit.
Figure 2:
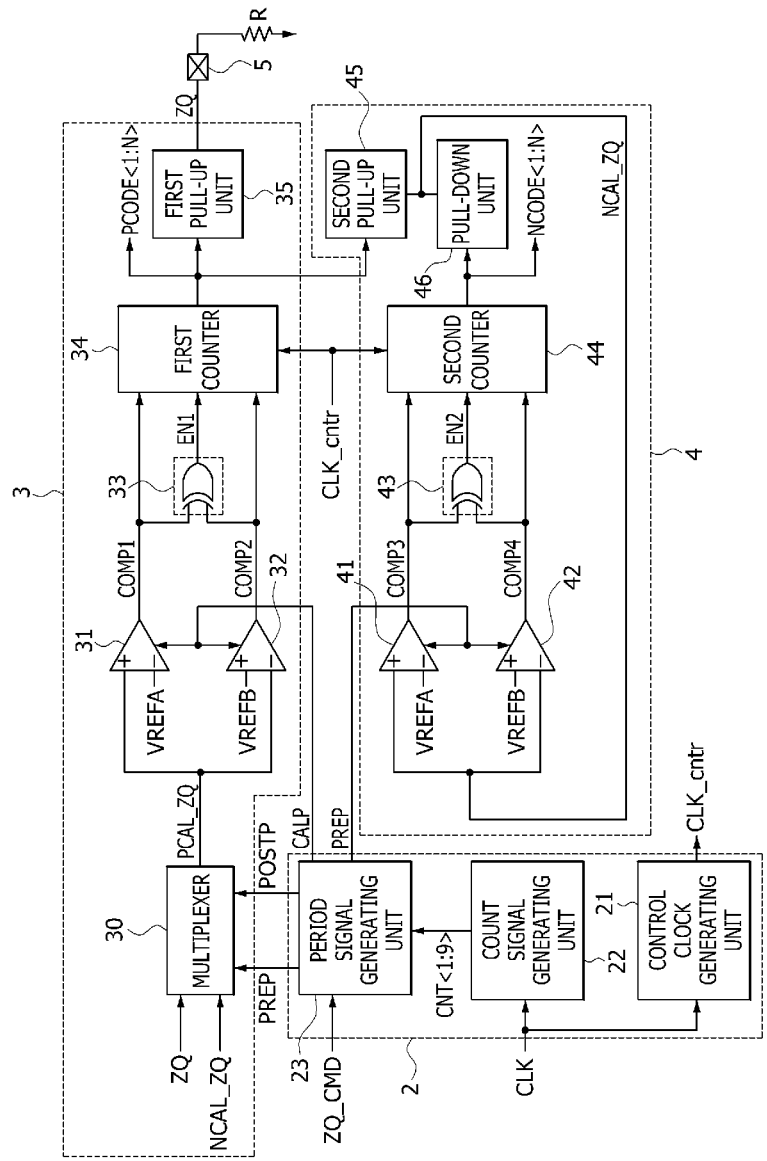
FIG. 2 is a diagram illustrating a structure of an impedance calibration circuit according to an exemplary embodiment of the present invention.

FIG. 2 is a diagram illustrating a structure of an impedance calibration circuit according to an exemplary embodiment of the present invention.

Referring to FIG. 2, an impedance calibration circuit according to an exemplary embodiment of the present invention includes an impedance calibration controlling unit 2, a pull-up code calibrating unit 3, a pull-down code calibrating unit 4, and a pad 5 to which an external resistor R is connected. The impedance calibration controlling unit 2 includes a count signal generating unit 22, a period signal generating unit 23, and a control clock generating unit 21. The pull-up code calibrating unit 3 includes a multiplexer 30, a first comparator 31, a second comparator 32, a first enable signal generating unit 33, a first counter 34, and a first pull-up unit 35. The pull-down calibrating unit 4 includes a third comparator 41, a fourth comparator 42, a second enable signal generating unit 43, a second counter 44, a second pull-up unit 45, and a pull-down unit 46.

The count signal generating unit 22, according to an example, divides a frequency of a clock signal CLK to generate first to ninth count signals CNT<1:9>. In this case, the first count signal CNT<1> may be obtained by dividing the frequency of the clock signal CLK by two, and also the second count signal CNT<2> may be obtained by dividing the frequency of the first count signal CNT<1> by two. Further, the third count signal CNT<3> may be obtained by dividing the frequency of the second count signal CNT<2> by two, and the ninth count signal CNT<9> may be obtained by dividing the frequency of the eight count signal CNT<8> by two. Thus, the first to ninth count signals CNT<1:9> are up-counted on a bit-by-bit basis from a level combination of 'H, L, L, L, L, L, L, L, L' to a level combination of 'H, H, H, H, H, H, H, H, H'. When the first to ninth count signals CNT<1:9> have a level combination of 'H, L, L, L, L, L, L, L, L', it means that the first count signal CNT<1> has a logic high level and the second to ninth count signals CNT<2:9> have a logic low level.

The period signal generating unit 23 generates a calibration period signal CALP that is activated for a certain period from the input time point of an impedance calibration command ZQ_CMD for an impedance calibration operation. Also, the period signal generating unit 23 generates a first period signal PREP that is activated during a first period from the input time point of the impedance calibration command ZQ_CMD, and a second period signal POSTP that is activated for a second period from the end time point of the first period. The activation period of the calibration period signal CALP is equal to the sum of the first period and the second period. A detailed structure of the period signal generating unit 23 will be described later with reference to FIG. 3.

The control clock generating unit 21 calibrates the frequency of the clock signal CLK and generates a control clock CLK_cntr for controlling the counting operation of the first counter 34 and the second counter 44. The counting operation of the first counter 34 and the second counter 44 may be performed once during one cycle of the control clock CLK_cntr, and the frequency of the control clock CLK_cntr may be set to a multiple of the frequency of the clock signal CLK. For example, if the frequency of the control clock CLK_cntr is set to the double frequency of the clock signal CLK, the counting operation of the first counter 34 and the second counter 44 is performed two times more rapidly than the case of performing the counting operation in synchronization with the clock signal CLK.

The multiplexer 30 outputs a pad voltage ZQ of the pad 5 as a second voltage PCAL_ZQ during the first period when the first period signal PREP is activated, and outputs a first voltage NCAL_ZQ as the second voltage PCAL_ZQ during the second period when the second period signal POSTP is activated. A detailed structure of the multiplexer 30 will be described later with reference to FIG. 4.

The first comparator 31 is driven in the activation period of the calibration period signal CALP. The first comparator 31 outputs a first comparison signal COMP1 of a logic high level if the second voltage PCAL_ZQ is higher than a first reference voltage VREFA, and outputs the first comparison signal COMP1 of a logic low level if the second voltage PCAL_ZQ is lower than the first reference voltage VREFA.

The second comparator 32 is driven in the activation period of the calibration period signal CALP. The second comparator 32 outputs a second comparison signal COMP2 of a logic low level if the second voltage PCAL_ZQ is higher than a second reference voltage VREFB, and outputs the second comparison signal COMP2 of a logic high level if the second voltage PCAL_ZQ is lower than the second reference voltage VREFB.

The first enable signal generating unit 33 generates a first enable signal EN1 activated to a logic high level, and drives the first counter 34, if one of the first comparison signal COMP1 and the second comparison signal COMP2 is at a logic high level. Also, the first enable signal generating unit 33 generates the first enable signal EN1 deactivated to a logic low level, and stops driving the first counter 34, if both the first comparison signal COMP1 and the second comparison signal COMP2 are at a logic low level.

If the second voltage PCAL_ZQ is higher than the first reference voltage VREFA and the second reference voltage VREFB (VREFA>VREFB), the first counter 34 receives the first comparison signal COMP1 of a logic high level and the second comparison signal COMP2 of a logic low level, and counts the first to $N^{th}$ pull-up codes PCODE<1:N> to increase the resistance of the first pull-up unit 35. If the second voltage PCAL_ZQ is lower than the second reference voltage VREFB, the first counter 34 receives the first comparison signal COMP1 of a logic low level and the second comparison signal COMP2 of a logic high level, and counts the first to $N^{th}$ pull-up codes PCODE<1:N> to decrease the resistance of the first pull-up unit 35. If the second voltage PCAL_ZQ has a level between the first reference voltage VREFA and the second reference voltage VREFB, the first counter 34 stops driving in response to the first enable signal EN1 deactivated to a logic low level.

The pull-up code calibrating unit 3, including the first comparator 31, the second comparator 32, the first enable signal generating unit 33, the first counter 34 and the first pull-up unit 35, counts the first to $N^{th}$ pull-up codes PCODE<1:N> to set the second voltage PCAL_ZQ to have a level between the first reference voltage VREFA and the second reference voltage VREFB. In general, the first reference voltage VREFA is set to be higher by a certain level than a half level of a power supply voltage, and the second reference voltage VREFB is set to be lower by a certain level than a half level of the power supply voltage. Thus, if the second voltage PCAL_ZQ is set to have a level between the first reference voltage VREFA and the second reference voltage VREFB, it is considered that the resistance of the first pull-up unit 35 is set to be equal to the resistance of the external resistor R.

The third comparator 41 is driven during the first period when the first period signal PREP is activated. The third comparator 41 outputs a third comparison signal COMP3 of a logic high level if the first voltage NCAL_ZQ is higher than the first reference voltage VREFA, and outputs the third comparison signal COMP3 of a logic low level if the first voltage NCAL_ZQ is lower than the first reference voltage VREFA. Here, the first voltage NCAL_ZQ is driven by the second pull-up unit 45 and the pull-down unit 46.

The fourth comparator 42 is driven during the first period when the first period signal PREP is activated. The fourth comparator 42 outputs a fourth comparison signal COMP4 of a logic low level if the first voltage NCAL_ZQ is higher than the second reference voltage VREFB, and outputs the fourth comparison signal COMP4 of a logic high level if the first voltage NCAL_ZQ is lower than the second reference voltage VREFB.

The second enable signal generating unit 43 generates a second enable signal EN2 activated to a logic high level, and drives the second counter 44, if one of the third comparison signal COMP3 and the fourth comparison signal COMP4 is at a logic high level. Also, the second enable signal generating unit 43 generates the second enable signal EN2 deactivated to a logic low level, and stops driving the second counter 44, if both the third comparison signal COMP3 and the fourth comparison signal COMP4 are at a logic low level.

If the first voltage NCAL_ZQ is higher than the first reference voltage VREFA, the second counter 44 receives the third comparison signal COMP3 of a logic high level and the fourth comparison signal COMP4 of a logic low level, and counts the first to $N^{th}$ pull-down codes NCODE<1:N> to decrease the resistance of the pull-down unit 46. If the first voltage NCAL_ZQ is lower than the second reference voltage VREFB, the second counter 44 receives the third comparison signal COMP3 of a logic low level and the fourth comparison signal COMP4 of a logic high level, and counts the first to $N^{th}$ pull-down codes NCODE<1:N> to increase the resistance of the pull-down unit 46. The second pull-up unit 45 receives the first to $N^{th}$ pull-up codes PCODE<1:N> to equalize the resistance to the resistance of the first pull-up unit 35. If the first voltage NCAL_ZQ has a level between the first reference voltage VREFA and the second reference voltage VREFB, the second counter 44 stops driving in response to the second enable signal EN2 having a logic low level.

The pull-down code calibrating unit 4 including the third comparator 41, the fourth comparator 42, the second enable signal generating unit 43, the second counter 44, the second pull-up unit 45 and the pull-down unit 46 counts the first to $N^{th}$ pull-down codes NCODE<1:N> to set the first voltage NCAL_ZQ to have a level between the first reference voltage VREFA and the second reference voltage VREFB. Thus, if the first voltage NCAL_ZQ is set to have a level between the first reference voltage VREFA and the second reference voltage VREFB, it is considered that the resistance of the pull-down unit 46 is set to be equal to the resistance of the second pull-up unit 45.

Figure 3:
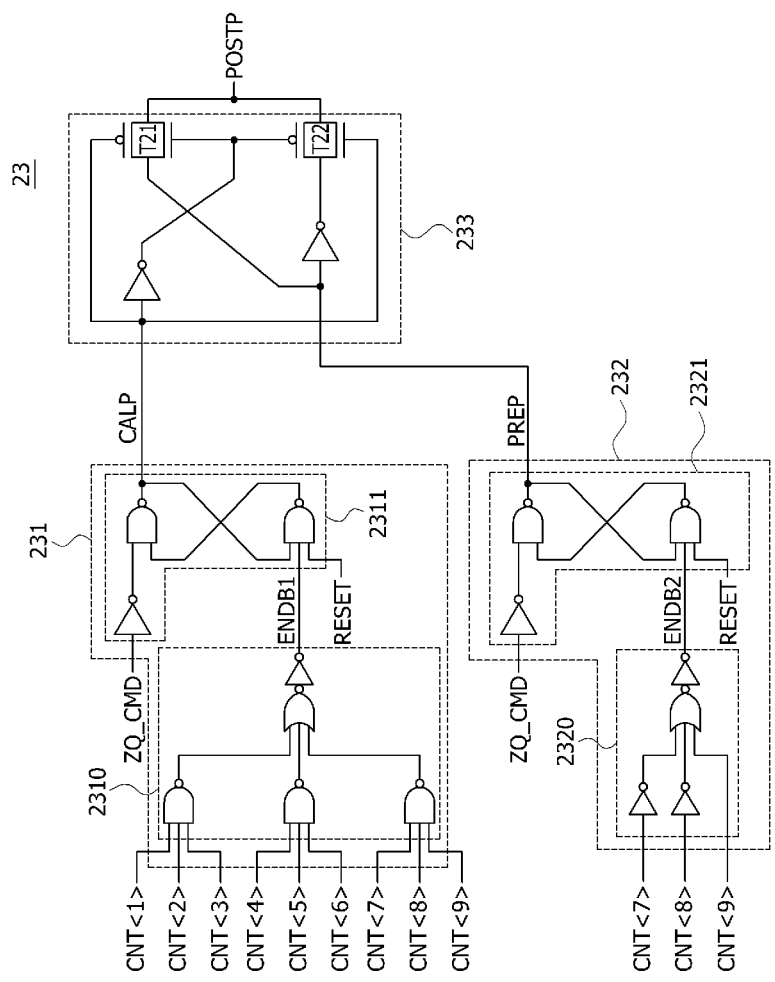
FIG. 3 is a circuit diagram of a period signal generating unit included in the impedance calibration circuit illustrated in FIG. 2.

FIG. 3 is a circuit diagram of the period signal generating unit 23 included in the impedance calibration circuit illustrated in FIG. 2.

Referring to FIG. 3, the period signal generating unit 23 includes a calibration period signal generating unit 231, a first period signal generating unit 232, and a second period signal generating unit 233.

The calibration period signal generating unit 231 includes a first end signal generating unit 2310 configured to generate a first end signal ENDB1 of a logic low level if the first to ninth count signals CNT<1:9> have a level combination of 'H, H, H, H, H, H, H, H, H', and a first latch unit 2311 configured to generate a calibration period signal CALP that is activated to a logic high level from the input time point of the impedance calibration command ZQ_CMD of a logic high level to the input time point of the first end signal ENDB1 of a logic low level.

The first period signal generating unit 232 includes a second end signal generating unit 2320 configured to generate a second end signal ENDB2 of a logic low level if the seventh to ninth count signals CNT<7:9> have a level combination of 'H, H, L', and a second latch unit 2321 configured to generate a first period signal PREP that is activated to a logic high level from the input time point of the impedance calibration command ZQ_CMD of a logic high level to the input time point of the second end signal ENDB2 of a logic low level.

The second period signal generating unit 233 includes a transmission unit T21 configured to transmit the first period signal PREP with the calibration period signal CALP of a logic low level as the second period signal POSTP, and a transmission unit T22 configured to transmit an inversion signal of the first period signal PREP with the calibration period signal CALP of a logic high level as the second period signal POSTP. The second period signal POSTP generated by the second period signal generating unit 233 becomes an inversion signal of the first period signal PREP when the calibration period signal CALP is activated to a logic high level. Thus, the first period signal PREP is activated to a logic high level in the first period from the input time point of the impedance calibration command ZQ_CMD to the time point when the first to ninth count signals CNT<1:9> have a level combination of 'L, L, L, L, L, L, H, H, L'. Also, the second period signal POSTP is activated to a logic high level in the second period from the time point when the first to ninth count signals CNT<1:9> have a level combination of 'L, L, L, L, L, L, H, H, L' to the time point when the first to ninth count signals CNT<1:9> have a level combination of 'H, H, H, H, H, H, H, H, H'.

Figure 4:
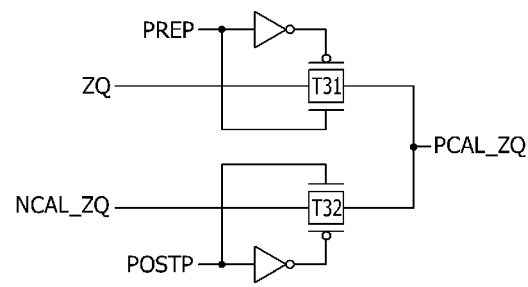
FIG. 4 is a circuit diagram of a multiplexer included in the impedance calibration circuit illustrated in FIG. 2.

FIG. 4 is a circuit diagram of the multiplexer 30 included in the impedance calibration circuit illustrated in FIG. 2.

Referring to FIG. 4, the multiplexer 30 includes a transmission unit T31 configured to transmit the pad voltage ZQ of the pad 5 as the second voltage PCAL_ZQ in the first period when the first period signal PREP is activated to a logic high level and a transmission unit T22 configured to transmit the first voltage NCAL_ZQ as the second voltage PCAL_ZQ in the second period when the second period signal POSTP is activated.

Figure 5:
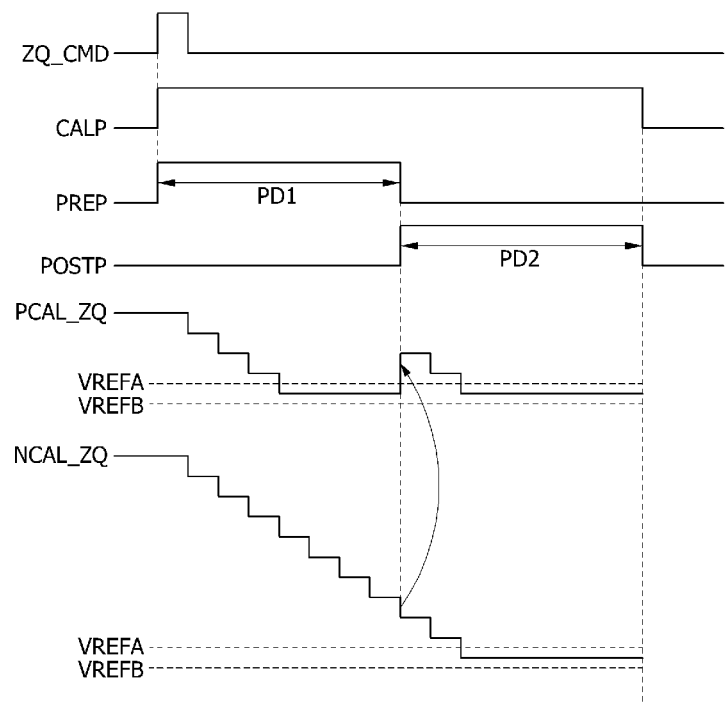
FIG. 5 is a timing diagram illustrating an operation of the impedance calibration circuit illustrated in FIG. 2.

FIG. 5 is a timing diagram illustrating an operation of the impedance calibration circuit illustrated in FIG. 2.

Referring to FIG. 5, the calibration period signal generating unit 231 of the impedance calibration controlling unit 2 generates the calibration period signal CALP that is activated to a logic high level in the period from the input time point of the impedance calibration command ZQ_CMD to the time point when the first to ninth count signals CNT<1:9> have a level combination of 'H, H, H, H, H, H, H, H, H'. Also, the first period signal generating unit 232 of the impedance calibration controlling unit 2 generates the first period signal PREP that is activated to a logic high level in a first period PD1, and the second period signal generating unit 233 generates the second period signal POSTP that is activated to a logic high level in a second period PD2.

The impedance calibration operation of the pull-up code calibrating unit 3 and the pull-down code calibrating unit 4 performed in the first period PD1 when the first period signal PREP is activated to a logic high level will be described below in detail.

Since the calibration period signal CALP and the first period signal PREP are activated to a logic high level, all of the first comparator 31, the second comparator 32, the third comparator 41 and the fourth comparator 42 are driven in the first period PD1. In the first period PD1, the multiplexer 30 transmits the pad voltage ZQ as the second voltage PCAL_ZQ.

In the first period PD1, the pull-up code calibrating unit 3 counts the first to $N^{th}$ pull-up codes PCODE<1:N> so that the second voltage PCAL_ZQ becomes set to have a level between the first reference voltage VREFA and the second reference voltage VREFB. Specifically, since the second voltage PCAL_ZQ is higher than the first reference voltage VREFA, the first comparator 31 generates the first comparison signal COMP1 of a logic high level and the second comparator 32 generates the second comparison signal COMP2 of a logic low level. Thus, the resistance of the first pull-up unit 35 is increased by the first to $N^{th}$ pull-up codes PCODE<1:N> counted by the first counter 34, so that the level of the second voltage PCAL_ZQ decreases gradually. The level of the second voltage PCAL_ZQ decreases to a level between the first reference voltage VREFA and the second reference voltage VREFB, so that the resistance of the first pull-up unit 35 becomes set to be equal to the resistance of the external resistor R and then the first counter 34 stops driving.

In the first period PD1, the pull-down code calibrating unit 4 counts the first to $N^{th}$ pull-down codes NCODE<1:N> so that the first voltage NCAL_ZQ becomes set to have a level between the first reference voltage VREFA and the second reference voltage VREFB. Specifically, since the first voltage NCAL_ZQ is higher than the first reference voltage VREFA, the third comparator 41 generates the third comparison signal COMP3 of a logic high level and the fourth comparator 42 generates the fourth comparison signal COMP4 of a logic low level. Thus, the resistance of the pull-down unit 46 is decreased by the first to $N^{th}$ pull-down codes NCODE<1:N> counted by the second counter 44, so that the level of the first voltage NCAL_ZQ decreases gradually. Also, the resistance of the second pull-up unit 45 is increased by the first to $N^{th}$ pull-up codes PCODE<1:N> counted in the pull-up code calibrating unit 3, so that the level of the first voltage NCAL_ZQ is decreased.

As illustrated in FIG. 5, the first voltage NCAL_ZQ has a higher level than the first reference voltage VREFA although the level of the first voltage NCAL_ZQ is decreased by the impedance calibration operation of the pull-up code calibrating unit 3 and the pull-down code calibrating unit 4 in the first period PD1. In this case, the impedance calibration circuit according to the exemplary embodiment of the present invention decreases the level of the first voltage NCAL_ZQ to a level between the first reference voltage VREFA and the second reference voltage VREFB by the impedance calibration operation of the pull-up code calibrating unit 3 and the pull-down code calibrating unit 4. This will be described below in detail.

In the second period PD2, the multiplexer 30 transmits the first voltage NCAL_ZQ as the second voltage PCAL_ZQ. Thus, like the first voltage NCAL_ZQ, the second voltage PCAL_ZQ maintaining a level between the first reference voltage VREFA and the second reference voltage VREFB changes to a level higher than the first reference voltage VREFA.

In the second period PD2, the pull-up code calibrating unit 3 counts the first to $N^{th}$ pull-up codes PCODE<1:N> so that the second voltage PCAL_ZQ becomes set to have a level between the first reference voltage VREFA and the second reference voltage VREFB. Specifically, since the second voltage PCAL_ZQ is higher than the first reference voltage VREFA, the first comparator 31 generates the first comparison signal COMP1 of a logic high level and the second comparator 32 generates the second comparison signal COMP2 of a logic low level. Thus, the resistance of the first pull-up unit 35 is increased by the first to $N^{th}$ pull-up codes PCODE<1:N> counted by the first counter 34, so that the level of the second voltage PCAL_ZQ is decreased gradually. After the level of the second voltage PCAL_ZQ is decreased to a level between the first reference voltage VREFA and the second reference voltage VREFB, the first counter 34 stops driving.

In the second period PD2, the first to $N^{th}$ pull-up codes PCODE<1:N> generated by the pull-up code calibrating unit 3 increases the resistance of the second pull-up unit 45 to decrease the level of the first voltage NCAL_ZQ. Thus, like the level of the second voltage PCAL_ZQ, the level of the first voltage NCAL_ZQ is decreased to a level between the first reference voltage VREFA and the second reference voltage VREFB. Accordingly, the resistance of the pull-down unit 46 becomes set to be equal to the resistance of the second pull-up unit 45.

As described above, the impedance calibration circuit according to the exemplary embodiment of the present invention again performs the counting operation of the pull-up codes PCODE<1:N> by reflecting the first voltage NCAL_ZQ in the second voltage PCAL_ZQ after completion of the counting operation of the pull-down codes NCODE<1:N> for calibration of the level of the first voltage NCAL_ZQ, thereby making it possible to prevent the occurrence of a calibration range over phenomenon that makes it impossible to equalize the resistance of the pull-down unit 46 to the resistance of the second pull-up unit 45.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An impedance calibration circuit comprising:
   a pull-up code calibrating unit configured to compare a pad voltage of a pad, to which an external resistor is connected, with a reference voltage during a first period to generate a pull-up code for calibrating the resistance of a first pull-up unit that pulls up the pad voltage, and compare a first voltage with the reference voltage during a second period from the end time point of the first period to generate the pull-up code; and
   a pull-down code calibrating unit comprising a second pull-up unit configured to calibrate the resistance in response to the pull-up code to pull up the first voltage and a pull-down unit configured to pull down the first voltage,
   wherein the pull-down code calibrating unit compares the first voltage with the reference voltage during the first period to generate a pull-down code for calibrating the resistance of the pull-down unit, wherein the first voltage is driven by the second pull-up unit and the pull-down unit.

2. The impedance calibration circuit of claim 1, wherein if the pad voltage has a higher level than a first reference voltage during the first period, the pull-up code calibrating unit counts the pull-up code to increase the resistance of the first pull-up unit; and if the pad voltage has a lower level than a second reference voltage during the first period, the pull-up code calibrating unit counts the pull-up code to decrease the resistance of the first pull-up unit.

3. The impedance calibration circuit of claim 2, wherein if the first voltage has a higher level than a first reference voltage during the second period, the pull-up code calibrating unit counts the pull-up code to increase the resistance of the first pull-up unit; and if the first voltage has a lower level than a second reference voltage during the second period, the pull-up code calibrating unit counts the pull-up code to decrease the resistance of the first pull-up unit.

4. The impedance calibration circuit of claim 3, wherein if the first voltage has a higher level than a first reference voltage during the second period, the pull-down code calibrating unit counts the pull-down code to decrease the resistance of the pull-down unit; and if the first voltage has a lower level than a second reference voltage during the second period, the pull-down code calibrating unit counts the pull-down code to increase the resistance of the pull-down unit.

5. The impedance calibration circuit of claim 1, further comprising an impedance calibration controlling unit configured to generate a first period signal activated during the first period, a second period signal activated during the second period from the end time point of the first period, and a calibration period signal activated during the first and second periods, in response to an impedance calibration command.

6. The impedance calibration circuit of claim 5, wherein the impedance calibration controlling unit comprises:
   a count signal generating unit configured to divide a frequency of a clock signal and generate count signals;
   a period signal generating unit configured to generate the first and second period signals and the calibration period signal in response to the count signals, the impedance calibration command and a reset signal; and
   a control clock generating unit configured to calibrate the frequency of the clock signal and generate a control clock for controlling a counting operation.

7. The impedance calibration circuit of claim 6, wherein the period signal generating unit comprises:
   a calibration period signal generating unit configured to generate the calibration period signal that is activated in response to the impedance calibration command and is deactivated according to the reset signal or a level combination of the count signals;
   a first period signal generating unit configured to generate the first period signal that is activated in response to the impedance calibration command and is deactivated according to the reset signal or a level combination of the count signals; and
   a second period signal generating unit configured to invert the first period signal in the activation period of the calibration period signal and generate the second period signal.

8. The impedance calibration circuit of claim 5, wherein the pull-up code calibrating unit comprises a multiplexer configured to selectively output the pad voltage or the first voltage in response to the first and second period signals.

9. The impedance calibration circuit of claim 8, wherein the multiplexer comprises:
   a first transmission unit configured to transmit the pad voltage as the output of the multiplexer in response to the first period signal; and
   a second transmission unit configured to transmit the first voltage as the output of the multiplexer in response to the second period signal.

10. The impedance calibration circuit of claim 8, wherein the pull-up code calibrating unit further comprises:
    a first comparator configured to compare the output of the multiplexer with a first reference voltage and generate a first comparison signal;
    a second comparator configured to compare the output of the multiplexer with a second reference voltage and generate a second comparison signal; and
    a first counter configured to count the pull-up code in response to the first and second comparison signals.

11. The impedance calibration circuit of claim 10, wherein the first and second comparators are driven in the activation period of the calibration period signal.

12. The impedance calibration circuit of claim 10, wherein the pull-up code calibrating unit further comprises a first enable signal generating unit configured to generate a first enable signal for calibration of the driving of the first counter in response to the first and second comparison signals.

13. The impedance calibration circuit of claim 5, wherein the pull-down code calibrating unit further comprises:
    a third comparator configured to compare the first voltage with a first reference voltage and generate a third comparison signal;
    a fourth comparator configured to compare the first voltage with a second reference voltage and generate a fourth comparison signal; and
    a second counter configured to count the pull-down code in response to the third and fourth comparison signals.

14. The impedance calibration circuit of claim 13, wherein the third and fourth comparators are driven in the activation period of the first period signal.

15. The impedance calibration circuit of claim 13, wherein the pull-down code calibrating unit further comprises a second enable signal generating unit configured to generate a second enable signal for calibration of the driving of the second counter in response to the third and fourth comparison signals.

16. An impedance calibration method comprising:
dividing an impedance calibration period into a first period and a second period;
comparing a pad voltage of a pad, to which an external resistor is connected, with a reference voltage during the first period to generate a pull-up code for calibrating the resistance of a first pull-up unit that pulls up the pad voltage and the resistance of a second pull-up unit that pulls up a first voltage;
comparing the first voltage with the reference voltage during the first period to generate a pull-down code for calibrating the resistance of a pull-down unit that pulls down the first voltage; and
comparing the first voltage with the reference voltage during the second period to generate the pull-up code, wherein the first voltage is driven by the second pull-up unit and the pull-down unit.

17. The impedance calibration method of claim 16, wherein the second period starts from the end time point of the first period.

18. The impedance calibration method of claim 16, wherein if the pad voltage has a higher level than a first reference voltage, the pull-up code is counted to increase the resistance of the first pull-up unit; and if the pad voltage has a lower level than a second reference voltage, the pull-up code is counted to decrease the resistance of the first pull-up unit.

19. The impedance calibration method of claim 16, wherein if the first voltage has a higher level than a first reference voltage, the pull-down code is counted to decrease the resistance of the pull-down unit; and if the first voltage has a lower level than a second reference voltage, the pull-down code is counted to increase the resistance of the pull-down unit.

20. The impedance calibration method of claim 16, wherein if the first voltage has a higher level than a first reference voltage, the pull-up code is counted to increase the resistance of the first pull-up unit; and if the first voltage has a lower level than a second reference voltage, the pull-up code is counted to decrease the resistance of the first pull-up unit.

* * * * *